US007869769B2

(12) United States Patent
Stengel et al.

(10) Patent No.: US 7,869,769 B2
(45) Date of Patent: Jan. 11, 2011

(54) METHOD AND APPARATUS FOR RECONFIGURABLE FREQUENCY GENERATION

(75) Inventors: Robert E. Stengel, Boynton Beach, FL (US); Thomas L. Gradishar, Boynton Beach, FL (US); Stephen T. Machan, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 591 days.

(21) Appl. No.: 11/946,072

(22) Filed: Nov. 28, 2007

(65) Prior Publication Data

US 2009/0137211 A1   May 28, 2009

(51) Int. Cl.
*H04B 1/40* (2006.01)
(52) U.S. Cl. .................. 455/76; 455/75; 455/102; 455/108; 455/110; 375/215; 375/242; 375/268; 375/294
(58) Field of Classification Search .......... 455/76, 455/75, 102, 108, 110, 126, 183.2, 260; 375/215, 375/242, 268, 294, 298, 327
See application file for complete search history.

(56) References Cited

U.S. PATENT DOCUMENTS 6,285,219 B1 * 9/2001 Pauls ..................... 327/3

7,656,931 B2 * 2/2010 Smith et al. .............. 375/131
2005/0237093 A1   10/2005 Wilhite et al.
2007/0024382 A1 * 2/2007 Zachan et al. ............. 331/34
2007/0030041 A1   2/2007 Huang et al.

FOREIGN PATENT DOCUMENTS

WO   03041276 A2   5/2003
WO   03063435 A1   7/2003

OTHER PUBLICATIONS

PCT International Search Report Application No. PCT/US2008/082399 dated Mar. 23, 2009—25 Pages.
Ramin Farjad-Rad et al; "A Low-Power Multiplying DLL for Low-Jitter Multigigahertz Clock Generation in Highly Integrated Digital Chips"; IEEE Journal of Solid-State Circuits., vol. 37, No. 12; pp. 1804-1812; Dec. 2002.

* cited by examiner

*Primary Examiner*—Tuan A Pham
(74) *Attorney, Agent, or Firm*—Barbara R. Doutre

(57) ABSTRACT

A frequency generator (100) takes a signal source (clock or carrier) (101) and generates a edge encoded direct digital modulated differential output signal (110). The differential signal (110) is applied to a frequency extension quadrature generator (FEQG) (112). The FEQG (112) includes a fractional differential wavelength delay locked loop (DLL) (280) and a frequency multiplier (240). The DLL (280) generates a control voltage (214) with which to control delays of the edge encoded modulation signal (110). A frequency extended quadrature function is applied to the periodic steady state input signal with edge encoded modulation (110), to provide the output signal set 113.

10 Claims, 7 Drawing Sheets

METHOD AND APPARATUS FOR RECONFIGURABLE FREQUENCY GENERATION

FIELD OF THE INVENTION

This invention relates generally to signal synthesis in communication devices and more particularly to quadrature signal generation for enabling multiband and multimode transceiver operation in such communication devices.

BACKGROUND OF THE INVENTION

As communication devices expand into software definable and cognitive arenas, the design efforts in multiband and multimode transceiver technology have had to rise to the challenges of enabling improved inter-connectivity and spectrum utilization. For example, the design of multiband and multimode synthesizers presents several challenges in the generation of signals and the control and suppression of noise upon those signals.

Many clocks used by today's digital circuits use square waves with short rise and fall times. Unfortunately, the noise generated by such clock signals can have adverse affects on circuits. Signal synthesis for transceiver architectures has focused on image rejection for direct conversion receivers and quadrature direct modulators for transmitters in order to minimize such noise. However, both of these functions require the use of a very broadband differential quadrature signal set with continuous frequency operation from 100 MHz up to 6 GHz.

In addition to the many signal quality specifications, there are three separate design parameters typically addressed in the design of an all-band signal source for wireless communication equipment. The first design parameter is a balanced or differential quadrature signal generator for a direct conversion receiver and a direct launch transmitter. The second parameter is a two state 50% duty cycle driver signal for switching mixer implementation. The third parameter is a low discrete part count, which is typically implemented by reducing the frequency range of the input signal source relative to the output frequency range.

A primary approach to transceiver synthesis for mobile battery operated communications equipment uses single band operation with a divide-by-four divider to achieve an accurate 50% duty cycle differential quadrature signal set. However, this approach requires a reference signal source operating at a frequency four times that of the intended output frequency in addition to power draining low noise dividers.

An alternative approach to transceiver synthesis uses a divide-by-two divider in which both the rising and falling edge of the reference signal define a quadrature signal set. Quadrature accuracy is defined by the duty cycle of the times two input frequency signal, assuming equal latency associated with the rise and fall signal processing. The trade-off, however, is a reduction in the input reference frequency by a factor of two for a duty cycle compensation network.

A third quadrature signal generation approach utilizes a poly phase network of resistor capacitors or inductor capacitors. This third approach is considered a frequency domain approach with the input frequency being equal to the output frequency. However, a poly phase network does not provide suitable quadrature generation for a two state time domain square wave signal used as a switching mixer driver.

Accordingly, it would be beneficial to have an improved means of processing modulated input signals for quadrature signal generation of transmitter and/or receiver operation of communication equipment, particularly battery operated communication equipment in the form of hand-held and mobile radios.

DETAILED DESCRIPTION OF THE DRAWINGS

Briefly, there is provided herein an improved signal synthesizer by implementing a delay lock loop (DLL) quadrature generation design for square wave signals. In accordance with various embodiments of the invention, the DLL system is implemented with a frequency extension function to provide an output differential quadrature signal set derived from a differential input signal. The DLL network is implemented with a fractional wavelength delay line, programmable charge pump, and independent programmable series delay. Compensation of quadrature offset for receiver and/or transmitter performance parameters is also provided.

Figure 1:
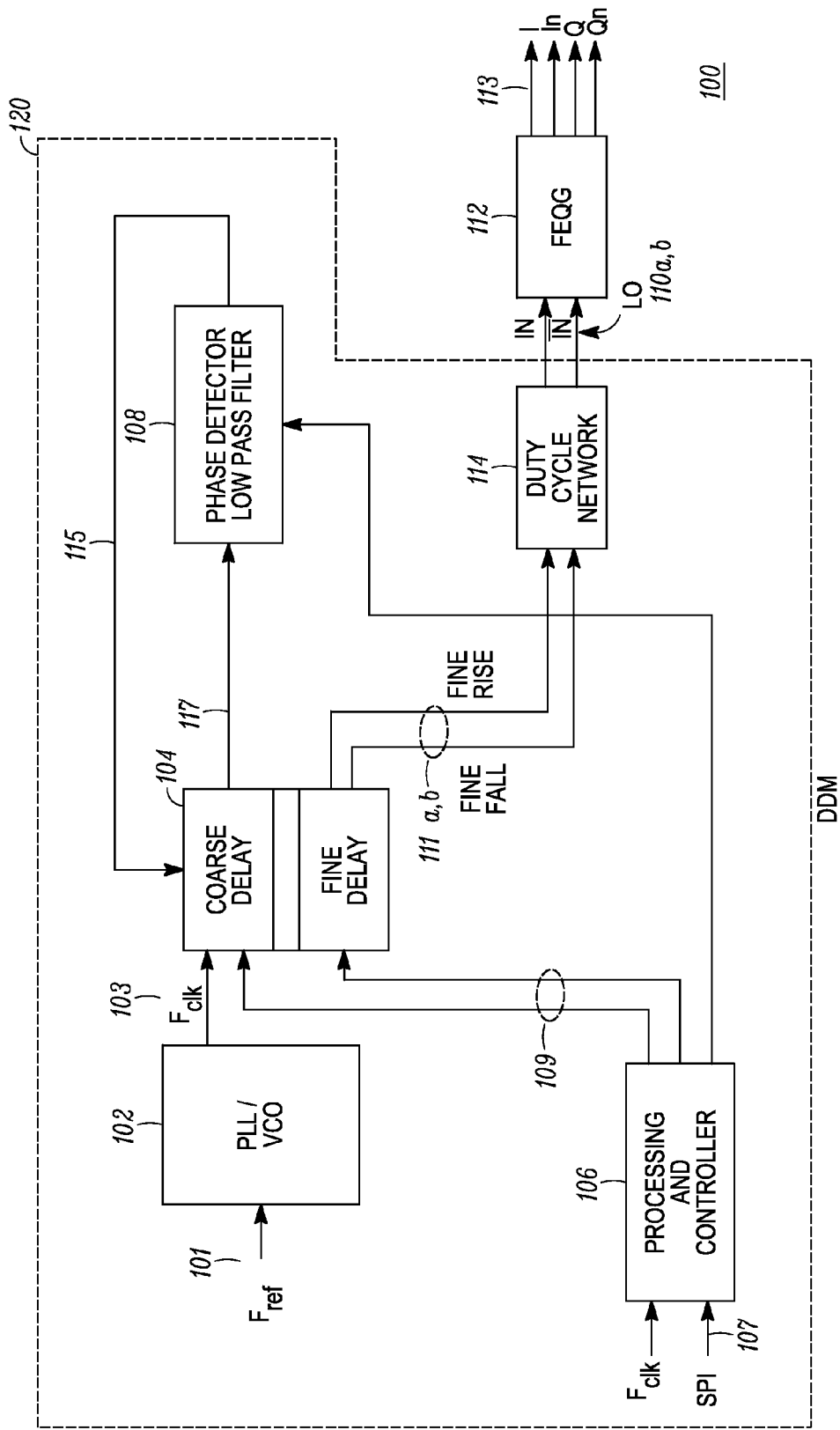
FIG. 1 is a block diagram of a synthesizer having a direct digital modulator (DDM) and frequency extension quadrature generator (FEQG) in accordance with some embodiments of the invention.

Referring to FIG. 1, there is shown a block diagram of a frequency generator system 100 formed in accordance with an embodiment of the invention. Frequency generator system 100 includes a direct digital modulator (DDM) 120 coupled to a frequency extension quadrature generator (FEQG) 112. The DDM 120 includes PLL/VCO 102 and controller 106 coupled to delay elements (coarse and fine) 104. The delay elements 104 are coupled to a phase detector low pass filter (LPF) 108 and a duty cycle network 114. The DDM 120 generates a differential two-state direct digitally modulated signal 110 (IN, $\overline{\text{IN}}$) and provides differential signal 110 to the quadrature generator frequency extension network 112 in order to generate a differential quadrature frequency extended output signal 113 (I, In, Q, Qn).

In operation, PLL/VCO 102 receives a reference frequency 101 and generates a signal source synthesis output $F_{clk}$ 103. The phase detector LPF 108 receives delay signal 117 and generates a control signal 115 with which to set the coarse delay value. Signal source $F_{clk}$ 103 is provided as an input to delay elements 104 and controller 106. Controller 106 is programmed via serial port interface (SPI) input 107 (from a processor not shown) to provide processing based signal edge selection and modulation encoding of the output signal 110. The controller 106 generates tap selection addresses 109 which are applied to the delay elements (course and fine) 104. The address lines 109 provide a tap selection sequence resulting in rise and fall signals 111a and 111b. These rise and fall signals represent the output signal 110 defined by the controller spi input programming 107. Differential signal 110a, b is applied to the FEQG 112 for the generation of a multiplied quadrature signal 113 in a manner to be described herein.

Figure 2:
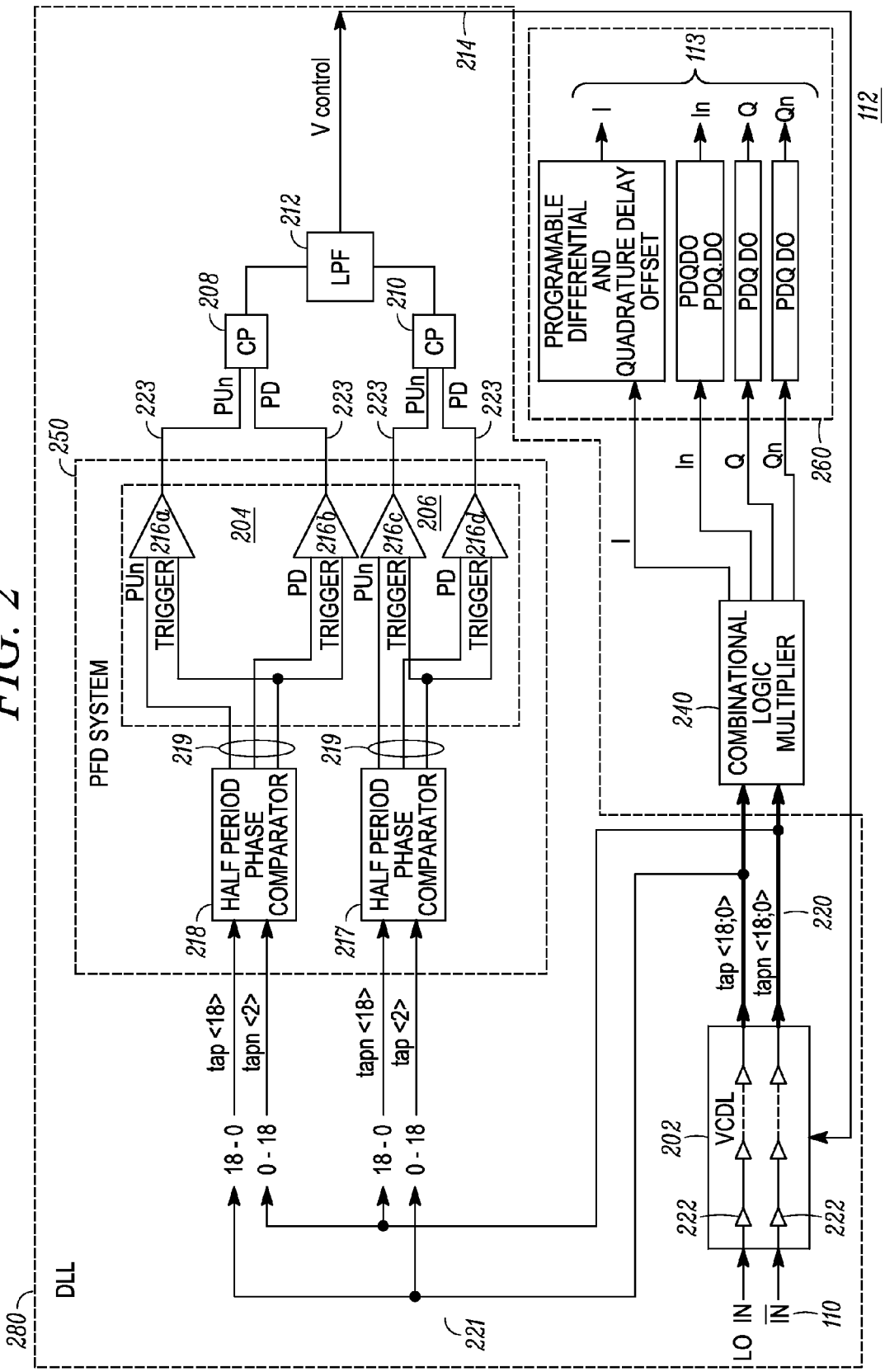
FIG. 2 is a more detailed block diagram of the FEQG of FIG. 1 in accordance with some embodiments of the invention.

In an embodiment of the invention shown in FIG. 2, the QGFE 112 is shown implemented with delay lock loop (DLL) 280 formed of a voltage controlled delay line (VCDL) 202, two dual phase frequency detectors (PFDs) shown here as half period phase comparators 217, 218, two sets of two initialization networks 204, 206, two charge pumps (CP) 208, 210, and a low pass filter (LPF) 212 providing delay control voltage 214. The half period phase comparators 217, 218 and initialization network 204, 206 form a PFD system 250 within DLL 280. The QGFE 112 further includes combinational logic 240 and a programmable differential and quadrature delay offset 260 for frequency extension.

In operation, the differential two state signals 110 (IN, $\overline{\text{IN}}$) of FIG. 1, are provided as input drive signals to the VCDL 202. The VCDL 202 preferably utilizes two sets of voltage controlled delay elements (VCDEs) 222 arranged in parallel with cross-coupled unit delay inverters thereby generating delayed signals 220 as an output. The use of cross coupled inverters along the delay network 202 reduces differential misalignment accumulation along the series connected delay line elements 222. Delayed signals 221 are tapped off unit delay inverters 222 and provided to the half period phase comparator elements 217, 218—two taps for each half period phase comparator. Delayed tapped signals 221 can be any combination of two sets of taps that are separated by a half period such as tap<1> and tapn<17> or tapn<1> and tap<17>. All delayed signals 220, tap<18;0> and tapn<18;0>, are provided to combinational logic 240.

The differential half wave delay line 202 may utilize, for example tap (1) and tap-not (17) or tap-not (1) and tap (17) as the input to the half period phase comparator networks 217 and 218. However, any set of differential taps separated by 16 equal delay values, having full wave signal properties relative to each other, and can be used. This provides phase or time delay offset measurement at 218 of two tap signals with common rising or falling edge processing. Likewise, phase or time delay offset measurement at 217 of two tap signals with common rising or falling edge processing is also provided. For a single-ended input, a half wave phase or time delay measurement would require a rising edge to be measured against a falling edge. This half wave phase detection is subject to rise and fall time mismatch, rise and fall time delay transfer latency mismatch, duty cycle offset, and other imbalance issues associated with processing of different time aligned signal edges. Thus, the use of a differential input is far preferable.

The two sets of edge processing half period phase comparators 217 and 218 are used to compare differential offset half cycle taps 221, to provide a cycle-by-cycle pulse-width modulated output relative to a cycle or period delay offset between any set of differential taps separated by 16 elements. For example, tap<18> tapn<2> are measured in one half period phase comparator 218 and tapn(<18> and tap<2> are measured in a second half period phase comparator 217 providing two delay measurements 219 offset by half a period in time at the DLL input frequency 101. As another example, tap<1> and tapn<17> are measured in one half period phase comparator and tapn<1> and tap<17> are measured in the second half period phase comparator providing two delay offset measurements 219 that are offset by half a period in time at the DLL input frequency 101. The two delay measurements 219 provide charge controls signals PUn, and Trigger inputs to 216a, PD and trigger inputs to 216b, PUn and Trigger inputs to 216c and PD, Trigger inputs to 216d. Once the initialization function is over and the half period phase comparators are functioning, the output signals 219 are passed to the charge pump blocks 208 and 210 as signals PUn, PD 223.

The two PFD measurements determine currents for charge pumps 208, 210 that are summed into a common shunt capacitor at LPF 212. The shunt capacitor serves as a control voltage 214 for the VCDL 202. The dual half period phase comparators with dual charge pumps 208, 210 and lowpass filter 212 provide a network to increase the control voltage 214 update rate by a factor of two allowing the ripple to be decreased by a factor of two with the same DLL lock time.

Figure 5:
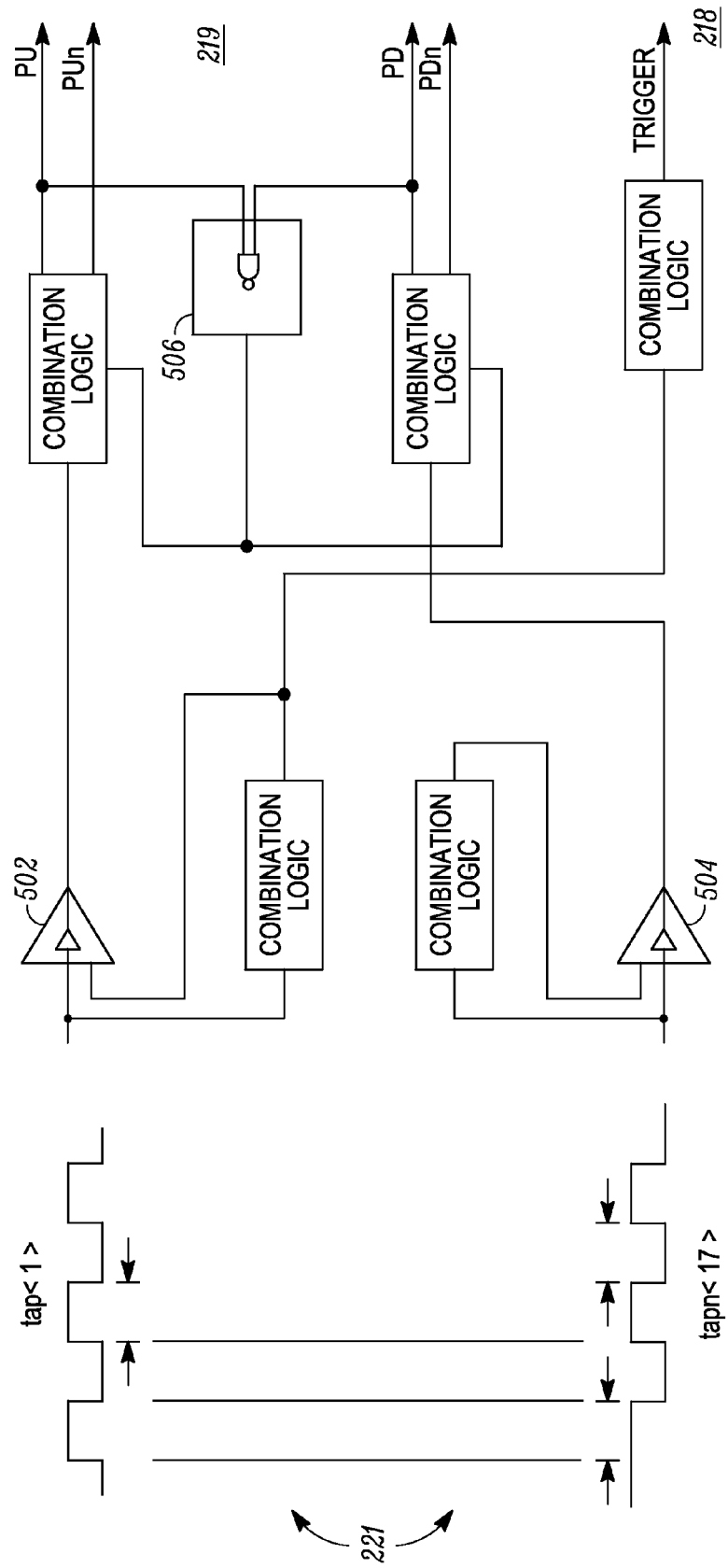
FIG. 5 is a schematic diagram of one of the half period phase comparator of the dual PFD networks of FIG. 3 in accordance with some embodiments.

Additionally, the dual delay measurement being converted to common control voltage signal provides a simple means of implementing dynamic matching also called chopping. Each of the two half period phase comparators 217 and 218 and charge pumps 208 and 210 have systematic variations or imbalance that are compensated by altering the tap connections between the two networks. A chopping implementation can be used to eliminate the need for a separate chopping clock and application of the signal path switching during a quiet static portion of the PFD process. The result is a feedback network with lower ripple and improved matching without increasing power dissipation or introducing additional chopping clock signals. An implementation of the half period phase comparator 218 will be discussed later in conjunction with FIG. 5.

Moving to the frequency extension aspect of the embodiment, the time offset signals 220 is provided combination logic 240 which provides a multiplication function to a differential quadrature two state square wave output signal (I, In, Q, Qn) 242. Programmable adjustment may be included, if desired, to help overcome systematic DLL offset and random delay line mismatch errors via programmable differential and quadrature delay offset 260. A state machine may be also used, if desired, to initialize the PFD system 250 and prevent false locking other than a half period delay. Further details of the frequency extension function are described later in conjunction with FIG. 6.

Each of the frequency extended quadrature signals 242 is applied to the programmable delay circuit 260 that can be the same as buffers 222 in VCDL block 202. These provide independent delay offset adjustment of each one of the differential quadrature signal members relative to the other three members. These adjustments can be applied at a transceiver system performance level to compensate for all of the transceiver circuit imperfections contributing to the system measurement.

For applications where the DLL 280 is required to have a 2:1 tuning range (for example 500 MHz to 1 GHz), each unit delay inverter 222 is implemented with synchronized rise and fall continuous time delay adjustability. The delay adjustment is ideally applied equally between the rise and fall edges of each delay element 222 along the delay line 202. An offset in the rise and fall time (at input 110) affects the duty cycle, creating a systematic jitter in the time offset output 220.

While described as a half wavelength DLL, the DLL 280 can be incorporated as a fractional wave length delay lock loop by implementing delay line 202 with differential M wave lengths plus a half wave length composite duration built with ($\frac{1}{2}$+M)/N equal delay steps (M=0, 1, 2, . . . ) & (N=1, 2, 3, 4, . . . ).

A current mirror (not shown) may be used to synchronize the rise and fall time of signal 220. This current mirror can be implemented, for example, by having the DLL feedback control voltage 214 adjust a pull down resistance of an nmos current source and a current mirror to a pmos pull up resistance within block 202 of FIG. 2. Since common edges are processed throughout the quadrature generation, frequency extension function, and output signal processing, accurate matching of rise and fall parameters is not essential.

The dual charge pumps 208, 210 may be implemented in a variety of ways. For example, the dual charge pumps may be implemented with four independent bits of programmable charge and discharge currents to provide a means of compensating the DLL offset by approximately +/−10 percent.

In cases where the DLL offset is defined as systematic time delay, the half cycle positive or negative offset associated with taps 221 separated by the 16 equal delay elements 202, results in a DLL offset with reduced quadrature accuracy and subharmonics in the extension function. Compensation of the DLL offset in this case, can be accomplished in a variety of ways. One example of compensating for DLL offset incurred by systematic time delay is accomplished by programming an offset or inverse in the charge and discharge current values. Programming the charge and discharge current values up or down together or synchronized provides a change in the DLL lock time and reduces ripple on control voltage 214.

Dithering can also be applied to mitigate quantization current limits of charge pumps 208, 210 and to further distribute and disrupt delay control voltage periodic signal processing as random jitter noise on the output signals (PUn and PD) 223.

In accordance with an embodiment of the invention, the two half period phase comparators 217, 218 are implemented with combination logic. The combination logic used in each phase comparator differs based on the specific processing desired for the different tap inputs into each phase comparator. An example of combination logic used for half period phase comparator 218 is provided in FIG. 5 relative to inputs tap<1> and tapn<17>. The combination logic functions to insure initial start up by processing the (n) rising edge of tap(17) or tapn(17) with (n+1) rising edge tapn(0) or tap(0). In this embodiment, inputs 221 are applied to the half period phase comparator function during the zero portion of the signal after the (n+1) rising edge is detected. In this embodiment, custom tri-state buffers 502, 504 are utilized to enable the half period phase comparator 218 with initialization programming, and a NAND gate 506 is used to enable the programmable initialization function. The outputs of the half period phase comparators 218 are applied to initialization network 216a, b to control charge pump conditions of charge pumps 208 via PU, PUn, trigger, and PD signals. The charge pump 208 is provided with one of three conditions, max, mid, or min charge pump value to aid with initial delay being close to the desired locked target value thereby precharging the lowpass filter 212 during wait states. For example, initialization applies supply, ground, or both supply and ground resulting in a mid value. The logic provided within the half period phase comparator 218 eliminates runt malformed pulses and insures correct control voltage transition to locked condition. Again, half period phase comparator 217 would have inputs tapn<1> and tap<17> with slightly different logic configurations.

Alternatively, the logic can be reconfigured such that phase comparison of more than two signals is performed. While the current example shows two sets of two signals that are applied to phase comparators, tap<1> & tapn<17> and tapn<1> & tap<17>, covering a total of four differential signals, another set of DPFD could be used at the same time with inputs tap<2> & tapn<18> and tapn<2> & tap<18>, to cover four additional signals.

The benefits of using a differential input into a half wavelength delay line 202 of the DLL network 280 are reduction in the added delay line noise, reduction in the random element delay mismatch accumulated tap error, and reduction in the delay line power dissipation. The dual PFD system 250 of the present invention provides an increase in the DLL offset measurement rate, a reduction in control voltage ripple, and a simple means of compensation imbalance. Programmable charge pump currents provides a means of adjusting DLL offset at a system level with receiver image or transmitter sideband rejection measurements.

Figure 3:
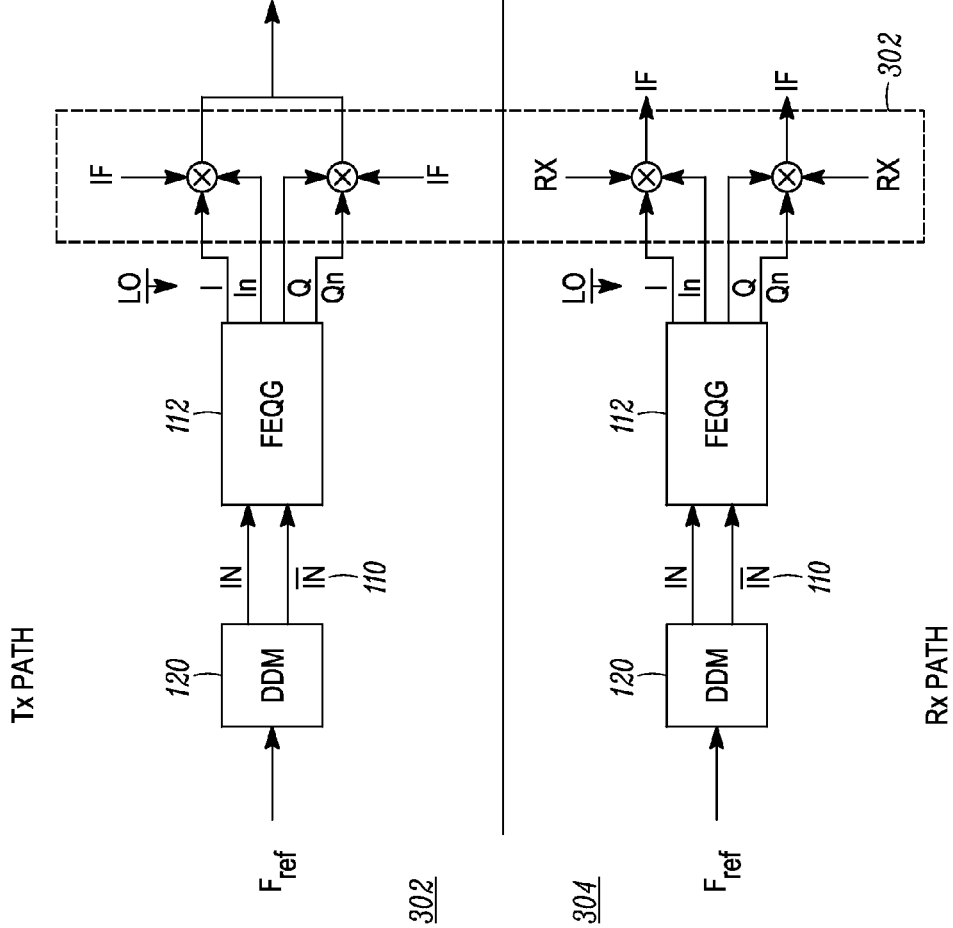
FIG. 3 is a block diagram of transmitter and receiver paths for a communication device utilizing the FEQG and DDM signal source of FIG. 1 in accordance with some embodiments.

FIG. 3 shows a communication device transceiver utilizing a synthesizer formed in accordance with the invention. Synthesizer 300 includes DDM 120 providing a differential two-state direct digitally modulated signal source 110 to FEQG 112 for the generation of quadrature LO signal 113 for use in transmit and receive paths 302, 304.

Operationally, the frequency generator formed and operating in accordance with the various embodiments of the invention provides a means of converting a differential signal to a differential quadrature frequency extended signal for multi-band operation. By modulating an input signal source to provide a modulated square wave LO signal to a frequency extension generator 112 as part of the DDS 100 for use in either transmit or receive modes. The method in accordance with the present invention further enables frequency multiplication of an input signal while maintaining a locked DLL condition.

Figure 4:
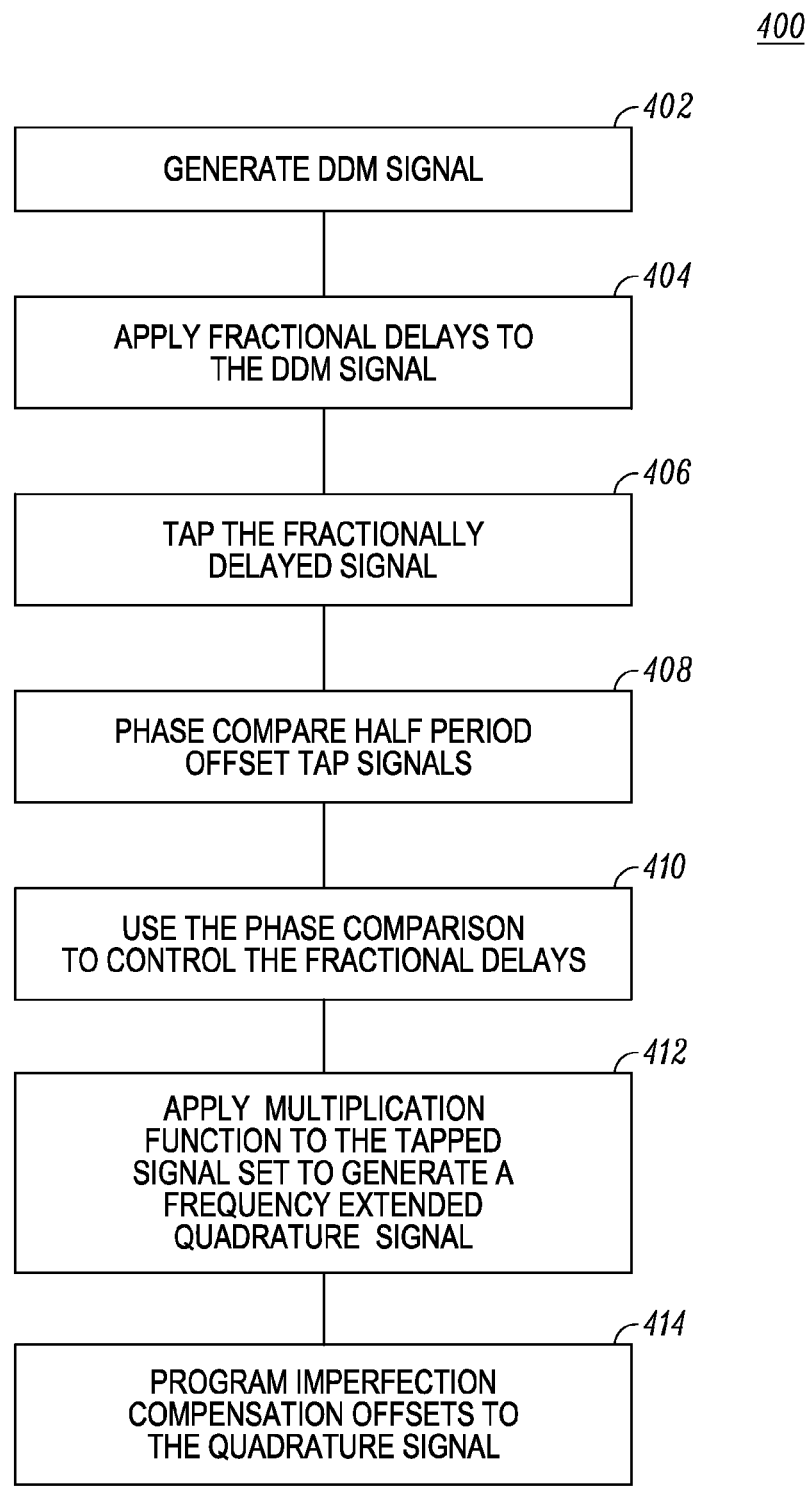
FIG. 4 is a flowchart for converting a differential signal into a quadrature signal in accordance with some embodiments.

FIG. 4 shows a flowchart 400 for converting a differential signal, such as signal 110, into a quadrature signal, such as signal 113. The method begins by generating an edge encoded direct digital modulated signal at 402 and applying fractional delays thereto at 404. The fractionally delayed signal is tapped at half period offsets 406, and the half period offset tapped signals are phase compared at 408. Phase comparison measurements are then used to control charge pumps from which a control voltage is programmed at 410. The control voltage (214) is used to control the fractional delays.

A multiplication function (240) is applied to the fractionally delayed signal (220) at 414 to produce a frequency extended quadrature output. Offsets are preferably programmed (260) at both the differential input and quadrature output at 416 to provide transceiver imperfection compensation.

Figure 6:
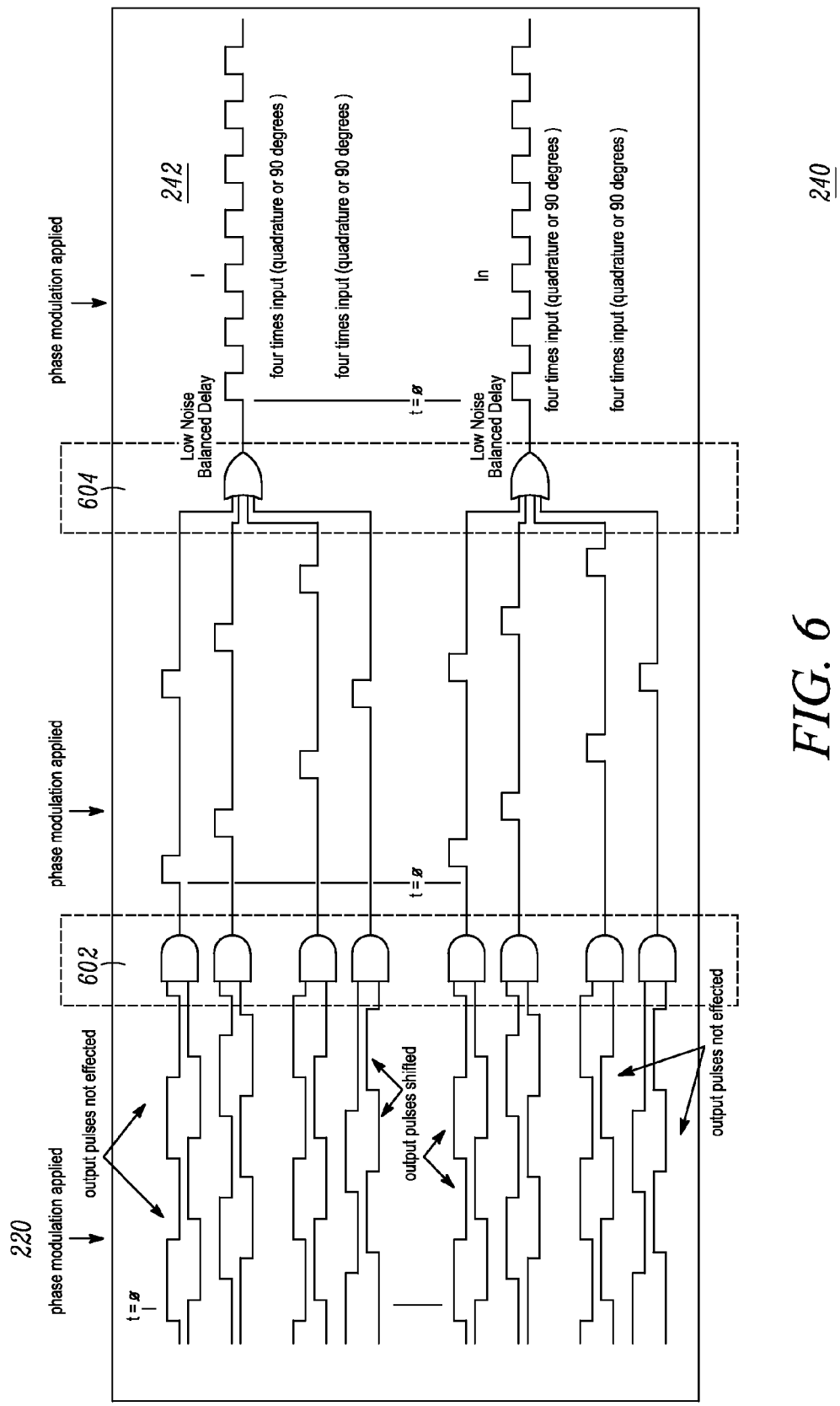
FIG. 6 shows an example of an implementation of frequency extension quadrature generation combinational logic 3 in accordance with some embodiments.

FIG. 6 shows an example of an implementation of the frequency extension quadrature generation combinational logic 240 in the form of an AND OR network providing pulse generation and summing to increase frequency by a factor of 4. Combinational logic 240 provides the frequency extension functionality to the FEQG 112. In this implementation, the full set of fractionally delayed signals 220, (having had phase modulation applied thereto by direct digital modulator 120 and programming of controller 106 of FIG. 1) provide a set of phase shifted and unshifted pulses to AND gates 602 within frequency extension combinational logic block 240. The half wave delayed signals 220 are applied to AND gates 602 to produce pulses that are summed with OR gates 604 which generate frequency extension output signal I, In 242. The I signal is four times the input frequency with 0 degrees phase offset, while the In signal is four time the input frequency with 180 degrees of differential offset from I. Although not illustrated, similar logic by shifted delays would produce output signals Q and Qn with four times the input with 90 degree phase offset and Qn of four times the input with 270 degrees phase offset.

The edge modulation is absorbed in one or more pulses of the differential quadrature output signal 113, the pulses being high (rise to falling edge) or low (fall to rising edge) portion of the signal that is otherwise 50% duty cycle. Modulation encoding, controlled via the spi programming into the controller block 106, is applied on the signals 111a and 111b and to the duty cycle network 114 for output signals 110a and 110b. Modulation encoding is thus applied to the rising and falling edges of time delay offset signals 220, that are not processed by the phase comparators 218, 217. When the modulation encoding is applied to the edges of half period delayed input signals 221, processed by the phase comparators 218 and 217, blanking is provided by a signal from the controller 106 to the phase low pass filter block 108 shown in FIG. 1.

Referring again to FIG. 6, input signals tap<1> and tapn<17> show a modulation input applied on the second falling edge of signal tap<1>. This encoded edge time shift is applied on all following edges of tap<1> signal and begins on the second rising edge of the half period shifted tapn<17> signal. Assuming the DLL provided the delay offset tap<1> and tapn<17> is correctly locked the rising edges before and after the encoding is applied every rising edge is aligned. Thus, the half wave phase comparator 217 or 218 will have no offset error with rising edges associated with tap<1> and tapn<17>. The time shifted signal will process through the half period phase comparator with no transit in the DLL control voltage signal.

A similar result is seen when processing signals tapn<1> and tap<17> through a half period phase comparator using the falling edges. An alternative half period phase comparator using rising edge processing would be blanked to eliminate the incorrect phase comparator error produced by the direct digital modulation encoding. An additional alternative half period phase comparator network would use a combination of rising and falling edges for both sets of input signals tap<1> & tapn<17> and tapn<1> & tap<17> with blanking applied on at least the tapn<1> & tap<17> rising edge and tap<1> & tapn<17> falling edge processing half period phase comparator networks.

Figure 7:
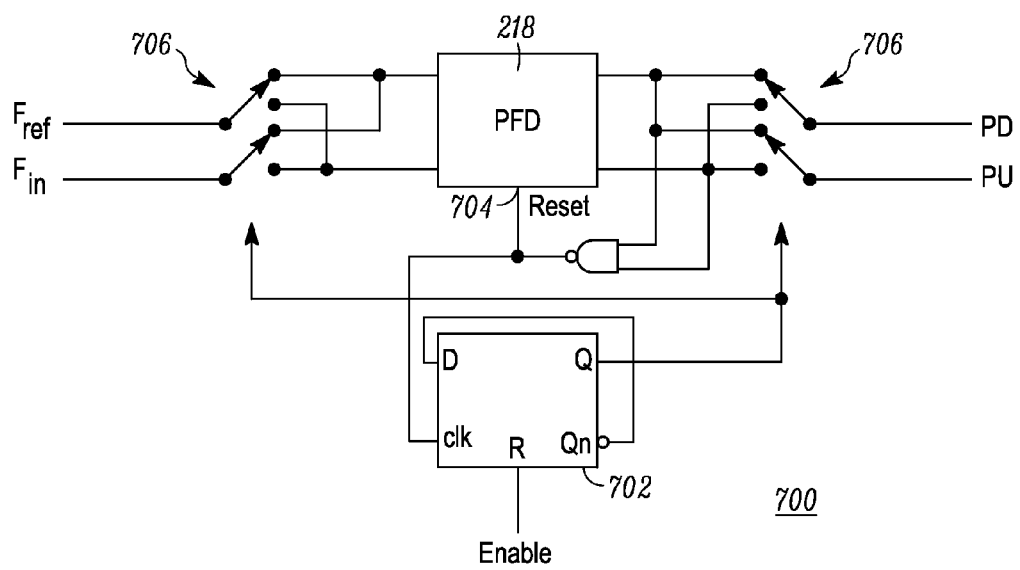
FIG. 7 is an example of an alternative PFD in accordance with some embodiments.

Referring to FIG. 7, there is shown an alternative phase frequency detector (PFD) implementation 700. The alternative implementation of half period phase comparator 218 provides balanced compensation via a synchronized input switching network. This embodiment can be used to overcome delay differences in the charge pumps up/down signals associated with the half period phase comparator. By using a tri-state inverter buffer or mux signal selection network 706 as the input and output to half period phase comparator 218, synchronized switching is achieved via the PFD's reset feedback 704 and toggling D flip-flop 702. The switching function is enabled when the PFD input signals are close to being phase locked which occurs as the delay locked loop system 280 is considered locked.

Accordingly, there has been provided a frequency extension quadrature generator 112 that can convert a direct digitally modulated differential signal 110 into a differential quadrature two state square wave output signal 113 via a fractional wave DLL network 280 in conjunction with combination logic 240. Programmable adjustment may be included, if desired, to help overcome systematic DLL offset and random delay line mismatch errors via programmable differential and quadrature delay offset 260. A state machine is used, to initialize the half period phase comparator and prevent false locking other than a half period delay.

The fractional wave DLL network 280 of the present invention provides the advantages of reduced noise, power dissipation, and reduced random mismatch accumulation the delay error. Utilizing a PFD system of two half period phase comparators and charge pumps provides a reduction in the control signal ripple with an offset update rate at twice the DLL operation frequency. The use of the programmable charge pump provides improved DLL systematic offset correction in addition to adaptive lock time to achieve a reduced delay lock loop time and reduced locked loop control signal ripple. The result is a quadrature generation and frequency extension function with programmable performance enhancement capability.

Inverter delay elements may alternatively be used instead of buffer delay elements for additional noise improvement and reduced power dissipation if needed. An alternative delay line network for the DLL system would be quadrature set of series connected delay buffers with a total quarter period fractional delay. The DDM signal source would provide four quadrature input signals 110 and each of the four series delay lines would be a quarter period long. The result is the same number of total delay elements and tap outputs as the two parallel half period delay lines. This can continue until the limit where the signal source 120 provides delay offset signals 220 directly.

While described in terms of a differential 500 MHz to 1 GHz input signal converted to a differential quadrature 500 MHz to 4 GHz square wave output signal, the frequency extension quadrature generation may be extended beyond ×4 to ×8 and ×16 to output frequencies of 16 GHz suitable for UWB application. Automated signal quality adjustments at the system level where compensation can be applied across all of the transceiver functions may also be achieved using the frequency generation of the present invention. As mentioned previously, delay line 202 and phase comparator 218 of FIG. 2 can also be configured to provide fractional logic, such as 1.5 period logic. Falling edge processing can be used instead of rising edge processing.

Programmable delays can be inserted in each of the pulse signals output from blocks 602 and the input to block 604 of FIG. 6. These would compensate any imperfection in the pulse generation network relative to each other.

In light of the foregoing description of the invention, it should be recognized that the present invention can be realized in hardware, software, or a combination of hardware and software. A method and system for signal processing transceiver optimization to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims.

What is claimed is:

1. A synthesizer, comprising:
   a direct digital modulator (DDM) generating a differential two-state direct digitally modulated signal source;
   a fractional wave differential delay lock loop (DLL) coupled to the DDM, the DLL utilizing a dual phase frequency detector (DPFD) with a voltage controlled fractional wave differential delay line network to generate time offset signals, the time offset signals having edge modulation applied thereto;
   a frequency multiplier coupled to the DLL for receiving the time offset signals and generating a differential quadrature frequency extended two-state square wave output signal.

2. The synthesizer of claim 1, wherein the fractional wave delay line comprises two parallel delay lines comprised of series connected delay elements.

3. The synthesizer of claim 2, wherein the fractional wave delay line comprises a half-wavelength delay line.

4. The synthesizer of claim 3, wherein the half-wavelength delay line provides a half cycle delay between any 16 series connected delay elements.

5. The synthesizer of claim 1, wherein the DPFD provides phase measurements with which to control the delay line control voltage.

6. The synthesizer of claim 5, further comprising first and second charge pumps generating the control voltage in response to the phase measurements provided by the DPFD.

7. The synthesizer of claim 1, wherein the fractional wave length delay lock loop includes a delay line comprising differential M wave lengths plus a half wave length composite duration built with $(½+M)/N$ equal delay steps (M =0, 1, 2, . . .) & (N =1, 2, 3, 4, . . .).

8. The synthesizer of claim 1, wherein the edge modulation of the time offset signal is absorbed in one or more pulses of the differential quadrature output signal, the pulses being high (rise to falling edge) or low (fall to rising edge) portion of the signal that is otherwise 50% duty cycle.

9. The synthesizer of claim 1, wherein the DPFD comprises:
   two parallel half period phase comparators that compare half period delayed input signals from the voltage controlled fractional wave differential delay line network and generate alternate time delayed error signals, one phase of the two parallel phase detector networks being blanked during the edge modulation portion of one of the half period delayed input signals.

10. The synthesizer of claim 6, wherein the DLL further comprises:
    an initialization network coupled to the two parallel PFD networks, the initialization network controlling charge pump conditions of the first and second charge pumps.

* * * * *